US012782461B2

(12) United States Patent
Park

(10) Patent No.: US 12,782,461 B2
(45) Date of Patent: Nov. 3, 2026

(54) METHOD AND APPARATUS FOR DIAGNOSING ABNORMAL CELL VOLTAGE OF ECO-FRIENDLY VEHICLE BATTERY

(71) Applicants: Hyundai Motor Company, Seoul (KR); Kia Corporation, Seoul (KR)

(72) Inventor: Tae Young Park, Yongin-si (KR)

(73) Assignees: HYUNDAI MOTOR COMPANY, Seoul (KR); KIA CORPORATION, Seoul (KR)

(*) Notice: Subject to any disclaimer, the term of this patent is extended or adjusted under 35 U.S.C. 154(b) by 176 days.

(21) Appl. No.: 18/796,500

(22) Filed: Aug. 7, 2024

(65) Prior Publication Data

US 2025/0231252 A1 Jul. 17, 2025

(30) Foreign Application Priority Data

Jan. 11, 2024 (KR) ........................ 10-2024-0004882

(51) Int. Cl.

| | |
|---|---|
| ***G01R 31/396*** | (2019.01) |
| ***B60L 3/00*** | (2019.01) |
| ***G01R 31/3842*** | (2019.01) |
| ***H01M 10/42*** | (2006.01) |
| ***H01M 10/44*** | (2006.01) |
| ***H01M 10/48*** | (2006.01) |

(52) U.S. Cl.

CPC .......... *G01R 31/396* (2019.01); *B60L 3/0046* (2013.01); *G01R 31/3842* (2019.01); *H01M 10/425* (2013.01); *H01M 10/441* (2013.01); *H01M 10/482* (2013.01); *H01M 2010/4271* (2013.01); *H01M 2220/20* (2013.01)

(58) Field of Classification Search

CPC .............. G01R 31/396; G01R 31/3842; G01R 19/16542; B60L 3/0046; B60L 2240/547

See application file for complete search history.

(56) References Cited

U.S. PATENT DOCUMENTS 6,983,212 B2 * 1/2006 Burns ........................ H02J 7/56 324/431

9,840,161 B2 * 12/2017 Chikkannanavar ... B60L 3/0046

* cited by examiner

*Primary Examiner* — Tung X Nguyen

(74) *Attorney, Agent, or Firm* — Morgan, Lewis & Bockius LLP

(57) ABSTRACT

In a method and apparatus for diagnosing voltage abnormality of a battery cell in an eco-friendly vehicle, the method for diagnosing voltage abnormality of a battery cell in an eco-friendly vehicle includes the steps of determining whether a voltage deviation of at least one cell of a plurality of cells forming a battery occurs at or above a first threshold voltage a threshold number of times or more than the threshold number during a one-cycle discharge period of the battery, and concluding that voltage deviation abnormality has occurred in the at least one cell if the voltage deviation of the at least one cell has occurred at or above the first threshold voltage the threshold number of times or more than the threshold number.

18 Claims, 4 Drawing Sheets

METHOD AND APPARATUS FOR DIAGNOSING ABNORMAL CELL VOLTAGE OF ECO-FRIENDLY VEHICLE BATTERY

CROSS REFERENCE TO RELATED APPLICATION

The present application claims priority to Korean Patent Application No. 10-2024-0004882, filed Jan. 11, 2024, the entire contents of which is incorporated herein for all purposes by this reference.

BACKGROUND OF THE PRESENT DISCLOSURE

Field of the Present Disclosure

The present disclosure relates to a battery management system, and more specifically, to a method and apparatus for diagnosing an abnormal voltage drop in an eco-friendly battery.

Description of Related Art

Eco-friendly vehicles such as hybrid electronic vehicle (HEV), plug-in HEV (PHEV), and electronic vehicle (EV) have a built-in battery, which is a storage device to store electrical energy, to drive the motor. These vehicles have built-in high-voltage batteries that are different from the low-voltage batteries provided in conventional internal combustion engine vehicles.

As these high-voltage batteries become increasingly dense and high-energy, even minor quality issues can lead to dangerous situations such as fire. Therefore, battery safety becomes increasingly important.

The safety logic of a conventional high-voltage battery has a diagnostic logic to detect an abnormal drop in battery voltage when the deviation of cell voltages is maintained at a certain level for a certain time period or when the cell voltages are maintained at a certain level for a certain time period. However, in the high-voltage battery of a specific vehicle, a voltage drop occurs that exceeds the range of the diagnostic logic used to detect the voltage drop. However, when a voltage drop exceeds the range of this diagnostic logic occurs, it is determined to be a voltage sensing error, and the abnormal voltage drop cannot be detected.

Therefore, in the present field of the present disclosure, there is a demand for a diagnostic logic that can detect an abnormal voltage drop even when the cell voltage drops rapidly.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a technology that can detect abnormal signs of a battery in advance.

Another technical object of the present disclosure is to provide a diagnostic logic of a high-voltage battery that ensures the safety of the high-voltage battery and allows a driver to operate a vehicle without an accident.

The technical objects to be achieved by the present disclosure are not limited to the technical objects mentioned above, and other technical objects not mentioned may be clearly understood by those skilled in the art from the following descriptions.

In various aspects of the present disclosure, a method for diagnosing voltage abnormality of a battery cell according to an exemplary embodiment of the present disclosure includes the steps of determining whether a voltage deviation of at least one cell of a plurality of cells forming a battery occurs at or above a first threshold voltage a threshold number of times or more than the threshold number during a one-cycle discharge period of the battery, and concluding that voltage deviation abnormality has occurred in the at least one cell if the voltage deviation of the at least one cell has occurred at or above the first threshold voltage the threshold number of times or more than the threshold number.

In the instant case, the method for diagnosing voltage abnormality may further include the steps of determining whether a voltage of the at least one cell is maintained at or below a second threshold voltage for a threshold time period, and concluding that low voltage abnormality has occurred in the at least one cell if the voltage of the at least one cell is maintained at or below the second threshold voltage for the threshold time period.

In the instant case, the one-cycle discharge period may be a time period until the vehicle switches from an ignition on (IG ON) mode to an ignition off (IG OFF) mode, or a time period until the battery is charged after the vehicle switches to the ignition OFF mode.

In the instant case, the voltage deviation may be defined as a voltage difference between an immediately preceding maximum or minimum value of voltage measured in the at least one cell and a maximum or minimum value of the voltage measured to a current point, and if the voltage deviation greater than or equal to the first threshold voltage occurs once, it may count whether a new voltage deviation is occurred based on the voltage measured from the current point.

In the instant case, the method for diagnosing voltage abnormality may further comprise, before the step of determining whether a number of times the voltage deviation of the at least one cell is greater than or equal to the first threshold voltage is greater than or equal to the threshold number of times, the step of determining whether a discharge current amount of the battery during the one-cycle discharge period of the battery is greater than or equal to a threshold current amount, wherein if the discharge current amount of the battery during the one-cycle discharge period of the battery is greater than or equal to the threshold current amount, the step of determining whether a number of times the voltage deviation of the at least one cell is greater than or equal to the first threshold voltage has occurred the threshold number of times or more may be performed.

In the instant case, the threshold current amount may be 0.5C.

In the instant case, if the voltage deviation or more than the voltage deviation occurs in the at least one cell, the method may further include the step of limiting the output of the battery to an emergency allowable power or less than the emergency allowable power.

In the instant case, the emergency allowable power may be 10 kW.

In the instant case, the method may further include the step of restricting the battery from being charged if the low voltage abnormality occurs in the at least one cell.

In the instant case, the first threshold voltage may be 500 mV, and the threshold number of times may be 5.

In the instant case, the second threshold voltage may be 0.5V, and the threshold time period may be 1 second.

Meanwhile, an apparatus for diagnosing voltage abnormality of a battery cell according to an exemplary embodiment of the present disclosure includes a battery that stores power energy for driving a vehicle and includes a plurality of cells, a sensor unit including a voltage sensor which is configured to detect a voltage of the plurality of cells, and a battery management unit that is configured to determine whether a voltage deviation of at least one cell of the plurality of cells forming the battery occurs at or above a first threshold voltage a threshold number of times or more than the threshold number during a one-cycle discharge period of the battery, and is configured to determine that voltage deviation abnormality has occurred in the at least one cell if the voltage deviation of the at least one cell has occurred at or above the first threshold voltage the threshold number of times or more than the threshold number.

In the instant case, the battery management unit may be configured to determine whether the voltage of the at least one cell is maintained at or below a second threshold voltage for a threshold time period, and determine that low voltage abnormality has occurred in the at least one cell if the voltage of the at least one cell is maintained at or below the second threshold voltage for the threshold time period.

In the instant case, the one-cycle discharge period may be a time period until the vehicle switches from an ignition on (IG ON) mode to an ignition off (IG OFF) mode, or a time period until the battery is charged after the vehicle switches to the ignition OFF mode.

In the instant case, the voltage deviation may be defined as a voltage difference between an immediately preceding maximum or minimum value of voltage measured in the at least one cell and a maximum or minimum value of the voltage measured to a current point, and if the voltage deviation greater than or equal to the first threshold voltage occurs once, it may count whether a new voltage deviation is occurred based on the voltage measured from the current point.

In the instant case, the battery management unit may be configured to determine whether a discharge current amount of the battery during the one-cycle discharge period of the battery is greater than or equal to a threshold current amount, wherein if the discharge current amount of the battery during the one-cycle discharge period of the battery is greater than or equal to the threshold current amount, the battery management unit may be configured to determine whether a number of times the voltage deviation of the at least one cell is greater than or equal to the first threshold voltage has occurred the threshold number of times or more.

In the instant case, the threshold current amount may be 0.5C.

In the instant case, if the voltage deviation or more than the voltage deviation occurs in the at least one cell, the battery management unit may limit the output of the battery to an emergency allowable power or less than the emergency allowable power.

In the instant case, the emergency allowable power may be 10 kW.

In the instant case, the battery management unit may restrict the battery from being charged if the low voltage abnormality occurs in the at least one cell.

In the instant case, the first threshold voltage may be 500 mV, and the threshold number of times may be 5.

In the instant case, the second threshold voltage may be 0.5V, and the threshold time period may be 1 second.

According to various embodiments of the present disclosure as described above, driver safety may be secured by applying the diagnostic logic to detect an abnormal voltage drop of a high-voltage battery while driving.

It will be appreciated by persons skilled in the art that the effects which may be achieved through the present disclosure are not limited to what has been described hereinabove and other advantages of the present disclosure will be more clearly understood from the following detailed description.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
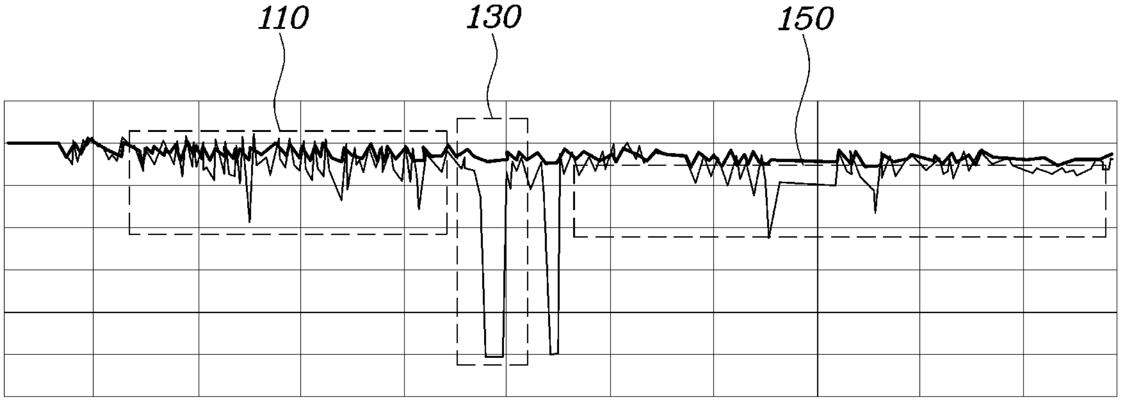
FIG. 1 illustrates an example of an abnormal voltage pattern of a battery cell which is not detected in a conventional battery cell abnormality diagnosis logic.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments of the present disclosure will be described in detail with reference to the appended drawings. The same or similar components are provided the same reference numbers and redundant description thereof is omitted. The suffixes "module" and "unit" of elements herein are used for convenience of description and thus may be used interchangeably and do not have any distinguishable meanings or functions. Furthermore, in describing the exemplary embodiments included in the specification, if it is determined that detailed descriptions of related known technologies may obscure the gist of the exemplary embodiments included in the present specification, the detailed descriptions will be omitted. Furthermore, the appended drawings are provided for easy understanding of embodiments included in the specification and do not limit technical spirits included in the specification, and the exemplary embodiments should be construed as including all modifications, equivalents, and alternatives falling within the spirit and scope of the present disclosure.

While terms, such as "first", "second", etc., may be used to describe various components, such components may not be limited by the above terms. The above terms are used only to distinguish one component from another.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements.

The singular forms are intended to include the plural forms as well, unless the context clearly indicates otherwise.

In the specification, it will be further understood that the terms "comprise" and "include" specify the presence of stated features, integers, steps, operations, elements, components, and/or combinations thereof, but do not preclude in advance the possibility of the presence or addition of one or more other features, integers, steps, operations, elements, components, and/or combinations.

FIG. 1 illustrates an example of an abnormal voltage pattern of a battery cell which is not detected in a conventional battery cell abnormality diagnosis logic.

In the conventional battery cell abnormality diagnosis logic, if the voltage deviation of a specific cell remains above a threshold for a certain time period or the voltage of a specific cell maintains a constant value for a certain time period, it is diagnosed that an abnormality has occurred in the cell.

For example, if the voltage deviation of a cell maintains 1V for 5 seconds or the voltage of a cell maintains 1.5V for more than 5 seconds, it may be diagnosed that an abnormality has occurred in the cell.

Referring to FIG. 1, the following cell voltage phenomenon occurs: within a first period 110, a voltage deviation rapidly increases, causing voltage instability, and within a second period 130, a cell voltage drops to 0V, and remains at 0V for a certain time period. Furthermore, within a third period 150, there is a case in which Min Cell, which has the minimum voltage value, is maintained among a plurality of cells forming a battery pack.

Figure 2:
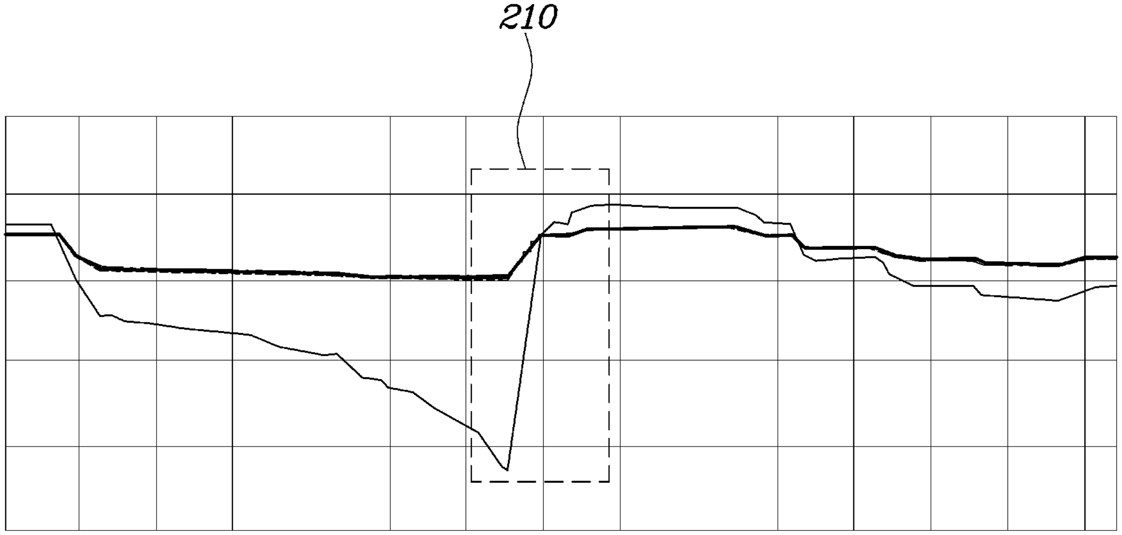
FIG. 2 illustrates an enlarged example of a portion of a first period in FIG. 1.

FIG. 2 illustrates an enlarged example of a portion of a first period 110 in FIG. 1.

Referring to FIG. 2, within a fourth period 210 within the first period 110, a voltage deviation occurs up to 1V or more. The phenomenon in which the voltage deviation of the cell occurs at or above 1V may occur five or more times within the first period 110.

However, in the conventional battery cell abnormality diagnosis logic, during the first period 110, the voltage deviation of the cell does not maintain 1V for more than 5 seconds, so it is not diagnosed that abnormality has occurred in the cell. During the second period 130, it is determined to be a voltage sensing error in a sensor and is not diagnosed as occurrence of cell abnormality, so that the cell abnormality is not diagnosed.

Hereinafter, the present disclosure proposes an apparatus and method that can diagnose the occurrence of the above phenomenon as a cell voltage deviation rather than determining it as a voltage sensing error in the sensor.

Figure 3:
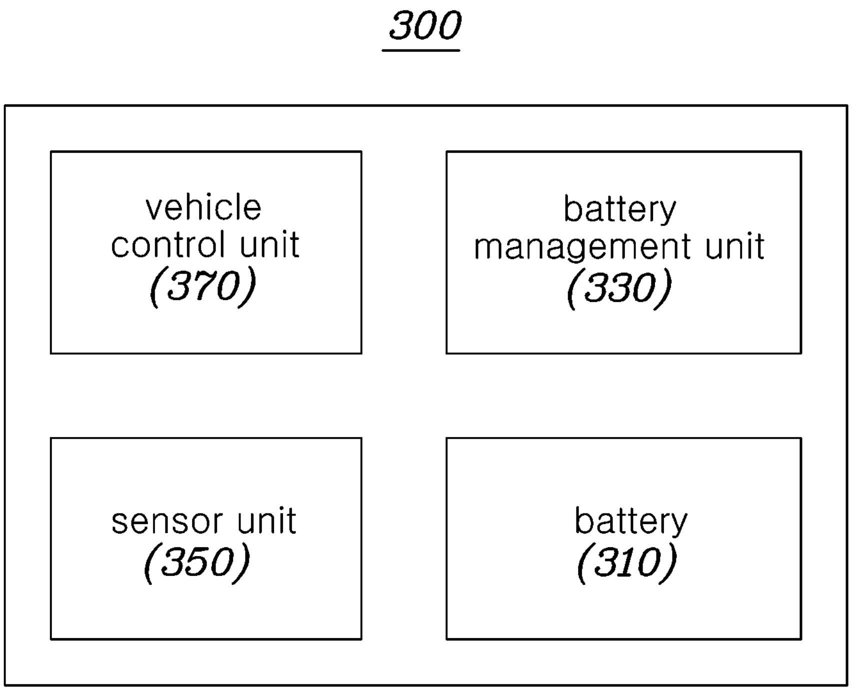
FIG. 3 is a block diagram schematically illustrating an apparatus for diagnosing battery cell voltage abnormality according to an exemplary embodiment of the present disclosure.

FIG. 3 is a block diagram schematically illustrating an apparatus for diagnosing battery cell voltage abnormality according to an exemplary embodiment of the present disclosure.

Referring to FIG. 3, an apparatus for diagnosing battery cell voltage abnormality according to the exemplary embodiment of the present disclosure includes a battery 310, a battery management unit 330, a sensor unit 350, and a vehicle control unit 370.

The battery 310 stores power energy for driving a vehicle and includes a plurality of cells.

The battery management unit 330 stores the maximum and minimum values of voltage measured in all cells forming the battery 310 during a one-cycle discharge period of the battery 310 when a vehicle is in an ignition on (IG ON) mode.

The reason for storing the maximum and minimum values of the voltage measured in all cells as described above is to prevent misdiagnosis due to voltage sensing abnormality.

In the instant case, the one-cycle discharge period may be defined as a time period until the vehicle switches from an ignition on (IG ON) mode to an ignition off (IG OFF) mode, or a time period until the battery 310 is charged after the vehicle switches to the ignition OFF mode.

Furthermore, although not illustrated in the drawing, the battery management unit 330 may store the maximum and minimum values of the voltage measured in all cells forming the battery 310 in a built-in memory or memory associated with the battery management unit 330.

In the instant case, the battery management unit 330 may store the maximum and minimum values of the voltage measured in all cells forming the battery 310 only when the discharge current amount of the battery 310 during the one-cycle discharge period of the battery 310 is greater than or equal to a threshold current amount, and perform the following operation for diagnosing the cell voltage deviation abnormality or operating a cell low voltage.

In the instant case, the reason for storing the maximum and minimum voltage values only when the discharge current amount of the battery 310 is greater than or equal to a threshold current amount is to prevent the battery 310 from misdiagnosing a cell voltage deviation due to a high load current.

In the instant case, the threshold current amount may be any current amount, for example, 0.5C.

Furthermore, the battery management unit 330 is configured to determine occurrence of voltage deviation abnormality in a specific cell of the battery 310 when in the corresponding cell, a voltage deviation occurs at or above a first threshold voltage a threshold number of times or more than the threshold number during a one-cycle discharge period of the battery 310, and stores the identifier (ID) or unique number (ID Number) of the cell in which the voltage deviation abnormality is occurred in the built-in memory or memory associated with the battery management unit 330.

In the instant case, the voltage deviation may be defined as a voltage difference between the immediately preceding maximum or minimum value of the voltage measured in the cell and the maximum or minimum value of the voltage measured to a current point. If the voltage deviation greater than or equal to the first threshold voltage occurs once, it is possible to count whether a new voltage deviation is occurred based on the voltage measured from the current point.

In the instant case, the first threshold voltage may be set to any value, for example, 500 mV.

Furthermore, the threshold number of times may be set to any number of times, for example, 5 times.

In the instant case, the battery management unit 330 may limit the output of the battery 310 if it is determined that the voltage deviation abnormality has occurred in the cell.

For example, the battery management unit 330 limits the output of the battery 310 to an emergency allowable power or less than the emergency allowable power if it is determined that the voltage deviation abnormality has occurred in the cell.

In the instant case, the emergency allowable power may be set to arbitrary power depending on the type of battery 310 or type of vehicle, and may be set to 10 KW, for example.

In addition, if it is determined that the voltage deviation abnormality has occurred in the cell, the battery management unit 330 may transmit a warning message to the driver of the vehicle and transmit information related to the occurrence of an abnormality in the battery 310 to the vehicle control unit 370.

In the instant case, the warning message may be transmitted through the vehicle's display screen or vehicle's speakers.

Furthermore, the battery management unit 330 does not diagnose a voltage sensing error but determines that low voltage abnormality has occurred in a specific cell of the battery 310 when the voltage of the corresponding cell is maintained at or below a second threshold voltage for a threshold time period during the one-cycle discharge period of the battery 310.

In the instant case, the second threshold voltage may be set to any value, for example, 0.5V.

Furthermore, the threshold time period may be set to any time, for example, 1 second.

In the instant case, the battery management unit 330 may limit the output and charging of the battery 310 if it is determined that the low voltage abnormality has occurred in the cell.

For example, if it is determined that the low voltage abnormality has occurred in the cell, the battery management unit 330 may limit the output of the battery 310 to the emergency allowable power or less and restrict the charging of the battery 310 for safety reasons.

For example, when attempting to charge the battery 310 when it is determined that the low voltage abnormality has occurred in the cell, the driver may be warned through the vehicle's speaker or display that the battery 310 cannot be charged.

In the instant case, the emergency allowable power may be set to any power depending on the type of battery 310 or type of vehicle, and may be set to 10 KW, for example.

In the instant case, when the low voltage abnormality has occurred in the cell, the battery management unit 330 may transmit a warning message to the driver of the vehicle and transmit information related to the occurrence of the low voltage abnormality in the cell of the battery 310 to the vehicle control unit 370.

The sensor unit 350 measures the voltage of the battery 310.

In the instant case, the sensor unit 350 may measure all changes in the voltages of cells forming the battery 310.

The vehicle control unit 370 is configured to control the vehicle based on the output of the battery 310.

In the instant case, the vehicle control unit 370 receives information related to the occurrence of the low voltage abnormality in the cell of the battery 310 from the battery management unit 330 and is configured to control the vehicle based on the present information.

For example, when the vehicle control unit 370 receives information related to the occurrence of the low voltage abnormality in the cell of the battery 310 from the battery management unit 330, it gradually reduces the speed of the vehicle or controls the vehicle to evacuate to a safe place.

Figure 4:
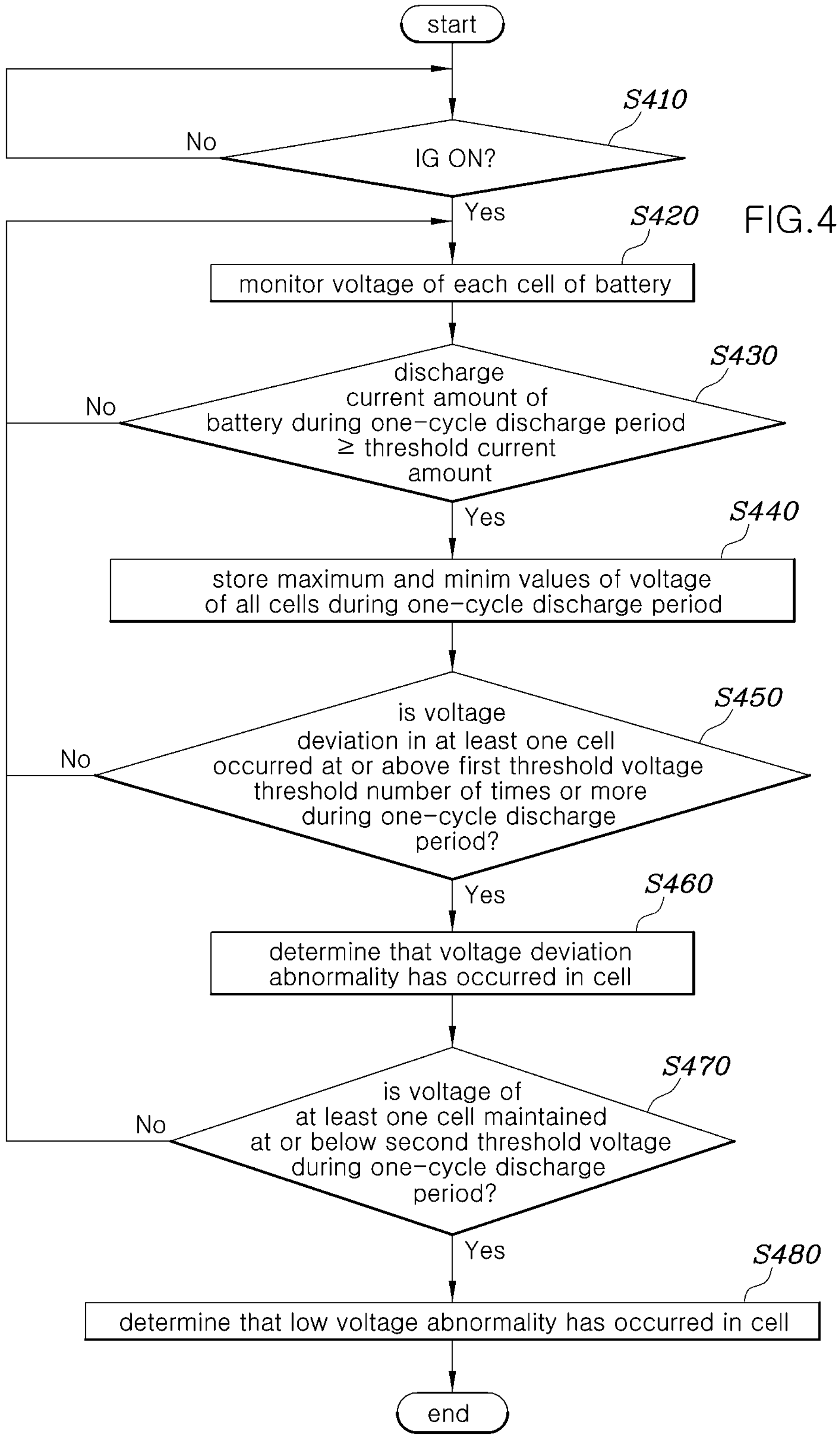
FIG. 4 is a flowchart illustrating a method for diagnosing battery cell voltage abnormality according to an exemplary embodiment of the present disclosure.

FIG. 4 is a flowchart illustrating a method for diagnosing battery cell voltage abnormality according to an exemplary embodiment of the present disclosure.

A method for diagnosing battery cell voltage abnormality according to the exemplary embodiment of the present disclosure may be performed by the battery management unit 330 of the apparatus for diagnosing battery cell voltage abnormality 300 of FIG. 3.

Referring to FIG. 4, the battery management unit 330 is configured to determine whether the vehicle is in an ignition on (IG ON) state (S410), and monitors the voltage of each of the battery cells forming the battery module of the vehicle when the vehicle is in the ignition on (IG ON) state (S420), and is configured to determine whether the discharge current amount of the battery 310 during one-cycle discharge period of the battery 310 is greater than or equal to the threshold current amount (S430).

As a result of the determination in step S430, if the discharge current amount of the battery 310 during the one-cycle discharge period is greater than or equal to the threshold current amount, the maximum and minimum values of the voltage measured in all cells forming the battery 310 are stored (S440).

In the instant case, the threshold current amount may be any current amount, for example, 0.5C.

In the instant case, the reason for storing the maximum and minimum values of the voltage measured in all cells forming the battery 310 is to prevent misdiagnosis due to the voltage sensing abnormality. The reason for storing the maximum and minimum voltage values only when the discharge current amount of the battery 310 is greater than or equal to the threshold current amount is to prevent the battery 310 from misdiagnosing the cell voltage deviation due to a high load current.

Furthermore, the battery management unit 330 is configured to determine whether a voltage deviation of a specific cell of the battery 310 occurs at or above the first threshold voltage the threshold number of times or more during the one-cycle discharge period of the battery 310 (S450), and is configured to determine that the voltage deviation abnormality has occurred in the corresponding cell if the voltage deviation of the specific cell of the battery 310 has occurred at or above the first threshold voltage the threshold number of times or more (S460).

In the instant case, if it is determined that the voltage deviation abnormality has occurred in the corresponding cell, the battery management unit 330 may store the identifier (ID) or unique number (ID Number) of the cell in which the voltage deviation abnormality has occurred in the built-in memory or memory associated with the battery management unit 330.

Furthermore, the battery management unit 330 may limit the output of the battery 310 when it is determined that the voltage deviation abnormality has occurred in the cell.

For example, when the battery management unit 330 determines that the voltage deviation abnormality has occurred in the cell, it may limit the output of the battery 310 to the emergency allowable power or less.

In the instant case, the emergency allowable power may be set to any power depending on the type of battery 310 or type of vehicle, and may be set to 10 KW, for example.

In the instant case, the first threshold voltage may be set to any value, for example, 500 mV.

Furthermore, the threshold number of times may be set to any number of times, for example, 5 times.

In addition, when it is determined that the voltage deviation abnormality has occurred in the cell, the battery management unit 330 may transmit a warning message to the driver of the vehicle and transmit information related to the occurrence of the abnormality in the battery 310 to the vehicle control unit 370.

In the instant case, the warning message may be transmitted through the vehicle's display screen or vehicle's speakers.

Furthermore, the battery management unit 330 is configured to determine whether the voltage of a specific cell of the battery 310 is maintained at or below the second threshold voltage for a threshold time period during the one-cycle discharge period of the battery 310 (S470), and is configured to determine that low voltage abnormality has occurred in the cell if the voltage of a specific cell is maintained at or below the second threshold voltage for the threshold time period (S480).

In the instant case, the second threshold voltage may be set to any value, for example, 0.5V.

Furthermore, the threshold time period may be set to any time, for example, 1 second.

In the instant case, the battery management unit 330 may limit the output and charging of the battery 310 if it is determined that the low voltage abnormality has occurred in the cell.

For example, if it is determined that the low voltage abnormality has occurred in the cell, the battery management unit 330 may limit the output of the battery 310 to the emergency allowable power or less and restrict charging of the battery 310 for safety reasons.

In the instant case, the emergency allowable power may be set to any power depending on the type of battery 310 or type of vehicle, and may be set to 10 KW, for example.

In the instant case, when the low voltage abnormality has occurred in the cell, the battery management unit 330 may transmit a warning message to the driver of the vehicle and transmit information related to the occurrence of the abnormality in the battery 310 to the vehicle control unit 370.

In the instant case, the vehicle control unit 370 may receive information related to the occurrence of the low voltage abnormality in the cell of the battery 310 from the battery management unit 330 and control the vehicle based on the present information.

For example, when the vehicle control unit 370 receives information related to the occurrence of the low voltage abnormality in the cell of the battery 310 from the battery management unit 330, it gradually reduces the speed of the vehicle or controls the vehicle to evacuate to a safe place.

In an exemplary embodiment of the present disclosure, each of the battery management unit 300 and the vehicle control unit 370 may be implemented by a processor in a form of hardware or software, or in a combination of hardware and software. Alternatively, the battery management unit 300 and the vehicle control unit 370 may be implemented by a processor may be implemented as a single processor in a form of hardware or software, or in a combination of hardware and software.

Figure 5:
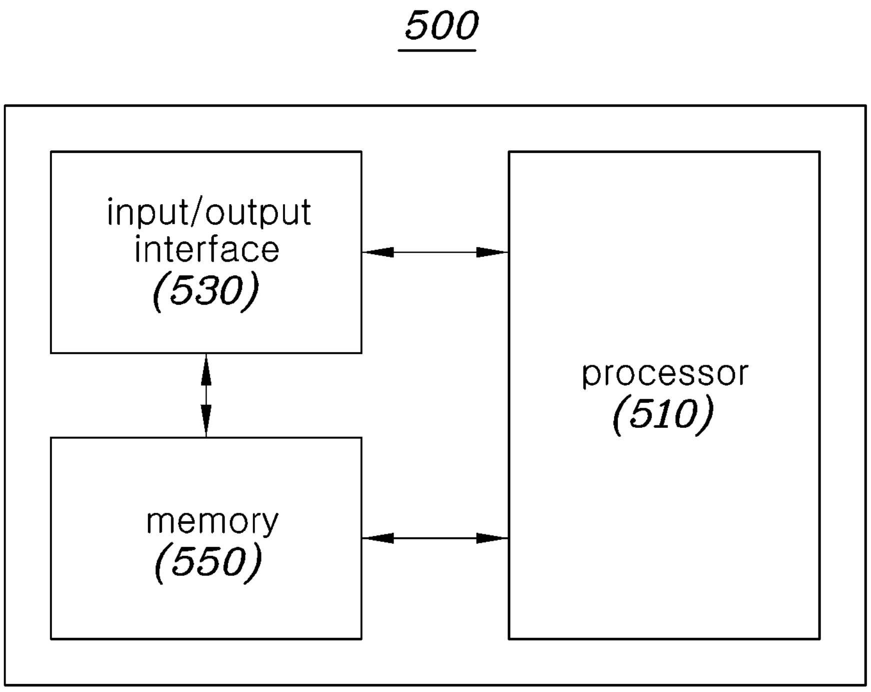
FIG. 5 is a block diagram illustrating a computer system according to an exemplary embodiment of the present disclosure.

FIG. 5 is a block diagram illustrating a computer system according to an exemplary embodiment of the present disclosure.

Referring to FIG. 5, an exemplary embodiment of the present disclosure may be implemented in a computer system such as a non-transitory computer-readable recording medium. As illustrated in FIG. 5, a computer system 500 includes a processor 510, an input/output interface 530, and a memory 550.

The processor 510 implements the method for diagnosing voltage abnormality of a battery cell in an eco-friendly vehicle provided in the present specification. The processor 510 implements all operations of the battery management unit 330 in the apparatus for diagnosing battery cell voltage abnormality 300 described in the exemplary embodiment of the present disclosure, and is configured to perform all operations of the method for diagnosing battery cell voltage abnormality according to FIG. 4.

For example, the processor 510 may be configured to determine whether a voltage deviation of at least one cell of a plurality of cells forming a battery occurs at or above a first threshold voltage a threshold number of times or more than the threshold number during a one-cycle discharge period of the battery, determine that voltage deviation abnormality has occurred in the at least one cell if the voltage deviation of the at least one cell has occurred at or above the first threshold voltage the threshold number of times or more, determine whether a voltage of the at least one cell is maintained at or below a second threshold voltage for a threshold time period, and determine that low voltage abnormality has occurred in the at least one cell if the voltage of the at least one cell is maintained at or below the second threshold voltage for the threshold time period.

In the instant case, the one-cycle discharge period may be a time period until the eco-friendly vehicle switches from an ignition on (IG ON) mode to an ignition off (OFF) mode, or a time period until the battery is charged after the eco-friendly vehicle switches to the ignition OFF mode.

In the instant case, the voltage deviation may be defined as a voltage difference between the immediately preceding maximum or minimum value of the voltage measured in the at least one cell and the maximum or minimum value of the voltage measured to a current point. If the voltage deviation greater than or equal to the first threshold voltage occurs once, it is possible to count whether a new voltage deviation is occurred based on the voltage measured from the current point.

In the instant case, the processor 510 may be configured to determine whether a discharge current amount of the battery during the one-cycle discharge period of the battery is greater than or equal to a threshold current amount, and if the discharge current amount of the battery during the one-cycle discharge period of the battery is greater than or equal to the threshold current amount, the processor 510 may be configured to determine whether the number of times the voltage deviation of at least one cell is greater than or equal to the first threshold voltage is greater than or equal to the threshold number of times.

In the instant case, the threshold current amount may be 0.5C.

In the instant case, if the voltage deviation or more than the voltage deviation occurs in the at least one cell, the processor 510 may limit the output of the battery to an emergency allowable power or less than the emergency allowable power.

In the instant case, the emergency allowable power may be 10 kW.

In the instant case, the processor 510 may restrict the battery from being charged if the low voltage abnormality occurs in the at least one cell.

In the instant case, the first threshold voltage may be 500 mV, and the threshold number of times may be 5.

In the instant case, the second threshold voltage may be 0.5V, and the threshold time period may be 1 second.

The input/output interface 530 may be connected to the processor 510 and directly obtain information or provide information to the user. For example, the input/output interface 530 may notify the driver of a warning that the voltage deviation abnormality has occurred in the battery cell or a warning that the low voltage abnormality has occurred in the battery cell.

In the instant case, the input/output interface 530 may include a speaker or display to audibly or visually notify a warning that the voltage deviation abnormality has occurred in the battery cell or a warning that the low voltage abnormality has occurred in the battery cell.

The memory 550 may be various types of volatile or non-volatile non-transitory storage media. In the instant case, the memory 550 stores at least one of the identifier (ID) or unique number (ID number) of the battery cell, the voltage of the battery cells, and a combination thereof.

According to the exemplary embodiments of the present disclosure described so far, signs of battery abnormality may be detected in advance.

Furthermore, the present disclosure provides a logic that diagnoses a high-voltage battery by diagnosing cells with abnormalities using cell balancing technology to balance the voltage deviation of the high-voltage battery.

Furthermore, by improving the monitoring function of the high-voltage battery, accidents may be prevented and the safety of eco-friendly vehicle is enhanced.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may be configured for processing data according to a program provided from the memory, and may be configured to generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the memory and the processor may be provided as one chip, or provided as separate chips.

In various exemplary embodiments of the present disclosure, the scope of the present disclosure includes software or machine-executable commands (e.g., an operating system, an application, firmware, a program, etc.) for enabling operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

In an exemplary embodiment of the present disclosure, the vehicle may be referred to as being based on a concept including various means of transportation. In some cases, the vehicle may be interpreted as being based on a concept including not only various means of land transportation, such as cars, motorcycles, trucks, and buses, that drive on roads but also various means of transportation such as airplanes, drones, ships, etc.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The term "and/or" may include a combination of a plurality of related listed items or any of a plurality of related listed items. For example, "A and/or B" includes all three cases such as "A", "B", and "A and B".

In exemplary embodiments of the present disclosure, "at least one of A and B" may refer to "at least one of A or B" or "at least one of combinations of at least one of A and B". Furthermore, "one or more of A and B" may refer to "one or more of A or B" or "one or more of combinations of one or more of A and B".

In the present specification, unless stated otherwise, a singular expression includes a plural expression unless the context clearly indicates otherwise.

In the exemplary embodiment of the present disclosure, it should be understood that a term such as "include" or "have" is directed to designate that the features, numbers, steps, operations, elements, parts, or combinations thereof described in the specification are present, and does not preclude the possibility of addition or presence of one or more other features, numbers, steps, operations, elements, parts, or combinations thereof.

According to an exemplary embodiment of the present disclosure, components may be combined with each other to be implemented as one, or some components may be omitted.

Hereinafter, the fact that pieces of hardware are coupled operably may include the fact that a direct and/or indirect connection between the pieces of hardware is established by wired and/or wirelessly.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A method for diagnosing voltage abnormality of a battery cell in a vehicle, the method comprising:

determining, by a processor, whether a voltage deviation of at least one cell among a plurality of cells forming a battery occurs at or above a first threshold voltage for at least a threshold number of times during a one-cycle discharge period of the battery;

determining, by the processor, that a voltage deviation abnormality has occurred in the at least one cell in response to determining that the voltage deviation of the at least one cell has occurred at or above the first threshold voltage for the at least a threshold number of times; and limiting, by the processor, an output of the battery to an emergency allowable power or less in response to determining that the voltage deviation abnormality has occurred in the at least one cell.

2. The method of claim 1, further including:

determining, by the processor, whether a voltage of the at least one cell is maintained at or below a second threshold voltage for a threshold time period; and determining, by the processor, that low voltage abnormality has occurred in the at least one cell in response to determining that the voltage of the at least one cell is maintained at or below the second threshold voltage for the threshold time period.

3. The method of claim 1, wherein the one-cycle discharge period is a time period until the vehicle switches from an ignition on (IG ON) mode to an ignition off (IG OFF) mode, or a time period until the battery is charged after the vehicle switches to the ignition OFF mode.

4. The method of claim 1, wherein the voltage deviation is defined as a voltage difference between an immediately preceding maximum or minimum value of voltage measured in the at least one cell and a maximum or minimum value of the voltage measured to a current point, and in response to determining that the voltage deviation greater than or equal to the first threshold voltage occurs once, the processor counts whether a new voltage deviation has occurred based on the voltage measured from the current point.

5. The method of claim 1, further including determining, by the processor, whether a discharge current amount of the battery during the one-cycle discharge period of the battery is greater than or equal to a threshold current amount, before determining whether a number of times the voltage deviation of the at least one cell is greater than or equal to the first threshold voltage is greater than or equal to the at least a threshold number of times, wherein in response to determining that the discharge current amount of the battery during the one-cycle discharge period of the battery is greater than or equal to the threshold current amount, determining whether the number of times the voltage deviation of the at least one cell is greater than or equal to the first threshold voltage has occurred the threshold number of times or more is performed.

6. The method of claim 5, wherein the threshold current amount is 0.5C.

7. The method of claim 1, wherein the emergency allowable power is 10 kW.

8. The method of claim 2, further including restricting, by the processor, the battery from being charged or controlling the vehicle in response to determining that the low voltage abnormality occurs in the at least one cell.

9. The method of claim 1, wherein the first threshold voltage is 500 mV, and the at least a threshold number of times is 5.

10. An apparatus for diagnosing voltage abnormality of a battery cell in a vehicle, the apparatus comprising:

a battery that stores power energy for driving the vehicle and includes a plurality of cells;

a sensor unit including a voltage sensor that detects a voltage of the plurality of cells; and a battery management unit that includes a processor and is configured to determine whether a voltage deviation of at least one cell among the plurality of cells forming the battery occurs at or above a first threshold voltage for at least a threshold number of times during a one-cycle discharge period of the battery, is configured to determine that voltage deviation abnormality has occurred in the at least one cell in response to determining that the voltage deviation of the at least one cell has occurred at or above the first threshold voltage for the at least a threshold number of times; and is configured to limit an output of the battery to an emergency allowable power or less in response to determining that the voltage deviation abnormality has occurred in the at least one cell.

11. The apparatus of claim 10, wherein the battery management unit is configured to determine whether a voltage of the at least one cell is maintained at or below a second threshold voltage for a threshold time period, and is configured to determine that low voltage abnormality has occurred in the at least one cell in response to determining that the voltage of the at least one cell is maintained at or below the second threshold voltage for the threshold time period.

12. The apparatus of claim 10, wherein the one-cycle discharge period is a time period until the vehicle switches from an ignition on (IG ON) mode to an ignition off (IG OFF) mode, or a time period until the battery is charged after the vehicle switches to the ignition OFF mode.

13. The apparatus of claim 10, wherein the voltage deviation is defined as a voltage difference between an immediately preceding maximum or minimum value of voltage measured in the at least one cell and a maximum or minimum value of the voltage measured to a current point, and in response to determining that the voltage deviation greater than or equal to the first threshold voltage occurs once, the battery management unit is configured to count whether a new voltage deviation has occurred based on the voltage measured from the current point.

14. The apparatus of claim 10, wherein the battery management unit is configured to determine whether a discharge current amount of the battery during the one-cycle discharge period of the battery is greater than or equal to a threshold current amount, wherein in response to determining that the discharge current amount of the battery during the one-cycle discharge period of the battery is greater than or equal to the threshold current amount, the battery management unit is configured to determine whether a number of times the voltage deviation of the at least one cell is greater than or equal to the first threshold voltage has occurred the at least a threshold number of times or more.

15. The apparatus of claim 14, wherein the threshold current amount is 0.5C.

16. The apparatus of claim 10, wherein the emergency allowable power is 10 kW.

17. The apparatus of claim 11, wherein the battery management unit is configured to restrict the battery from being charged or to control the vehicle in response to determining that the low voltage abnormality occurs in the at least one cell.

18. The apparatus of claim 10, wherein the first threshold voltage is 500 mV, and the at least a threshold number of times is 5.

* * * * *